United States Patent
Tsai et al.

(10) Patent No.: US 8,300,420 B2
(45) Date of Patent: Oct. 30, 2012

(54) CIRCUIT SUBSTRATE FOR MOUNTING ELECTRONIC COMPONENT AND CIRCUIT SUBSTRATE ASSEMBLY HAVING SAME

(75) Inventors: Chung-Jen Tsai, Tayuan (TW);
Hung-Yi Chang, Tayuan (TW);
Chia-Cheng Chen, Tayuan (TW);
Meng-Chieh Hsu, Tayuan (TW);
Cheng-Hsien Lin, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 290 days.

(21) Appl. No.: 12/471,396

(22) Filed: May 24, 2009

(65) Prior Publication Data

US 2010/0051332 A1   Mar. 4, 2010

(51) Int. Cl.
*H05K 7/00* (2006.01)
*H05K 1/03* (2006.01)
*H05K 1/16* (2006.01)
*H05K 1/18* (2006.01)
*H05K 7/10* (2006.01)

(52) U.S. Cl. ........ 361/760; 174/256; 174/260; 361/761; 361/763; 361/768; 361/779; 977/722; 977/723; 977/730; 977/742; 977/778

(58) Field of Classification Search .......... 174/260, 174/262–266, 256; 361/783, 760–761, 763, 361/768, 779; 977/762, 722, 730, 778, 784, 977/842, 742, 723
See application file for complete search history.

(56) References Cited

U.S. PATENT DOCUMENTS

| 6,372,351 | B1* | 4/2002 | Takemiya et al. | 428/416 |
|---|---|---|---|---|
| 6,924,335 | B2* | 8/2005 | Fan et al. | 524/495 |
| 7,268,423 | B2* | 9/2007 | Beer et al. | 257/698 |
| 2003/0030356 | A1* | 2/2003 | Fran et al. | 313/310 |
| 2004/0131835 | A1* | 7/2004 | Schmitt et al. | 428/293.1 |
| 2004/0265489 | A1* | 12/2004 | Dubin | 427/212 |
| 2004/0266065 | A1* | 12/2004 | Zhang et al. | 438/122 |
| 2005/0026531 | A1* | 2/2005 | Ohnuma | 445/50 |
| 2005/0048697 | A1* | 3/2005 | Uang et al. | 438/108 |
| 2005/0078453 | A1* | 4/2005 | Chu et al. | 361/709 |
| 2005/0142933 | A1* | 6/2005 | Beer et al. | 439/540.1 |
| 2005/0167755 | A1* | 8/2005 | Dubin et al. | 257/368 |
| 2006/0021564 | A1* | 2/2006 | Norman et al. | 117/84 |
| 2006/0068195 | A1* | 3/2006 | Majumdar et al. | 428/323 |
| 2006/0081989 | A1* | 4/2006 | Uang et al. | 257/753 |
| 2006/0097252 | A1* | 5/2006 | Basavanhally et al. | 257/41 |

(Continued)

FOREIGN PATENT DOCUMENTS

CN    101095226 A    12/2007
(Continued)

*Primary Examiner* — Timothy Thompson
*Assistant Examiner* — Sherman Ng
(74) *Attorney, Agent, or Firm* — Altis Law Group, Inc.

(57) ABSTRACT

A circuit substrate includes an electrically conductive layer having electrically conductive patterns formed therein, an insulating layer having a through hole, and a composite layer positioned between the electrically conductive layer and the insulating layer. The through hole is configured for having an electronic component mounted thereon. The composite layer includes a polymer matrix and at least one carbon nanotube bundle embedded in the polymer matrix. One end of the at least one carbon nanotube bundle contacts the electrically conductive patterns, and the other is exposed in the through hole of the insulation layer.

20 Claims, 14 Drawing Sheets

U.S. PATENT DOCUMENTS

| | | | |
|---|---|---|---|
| 2006/0118791 A1* | 6/2006 | Leu et al. | 257/77 |
| 2006/0234056 A1* | 10/2006 | Huang et al. | 428/408 |
| 2006/0243972 A1* | 11/2006 | Uang et al. | 257/40 |
| 2007/0003472 A1* | 1/2007 | Tolt | 423/447.3 |
| 2007/0053166 A1* | 3/2007 | Hwang et al. | 361/717 |
| 2008/0128122 A1* | 6/2008 | Huang et al. | 165/185 |
| 2009/0068387 A1* | 3/2009 | Panzer et al. | 428/40.1 |

FOREIGN PATENT DOCUMENTS

WO    WO 2006048843 A2 *  5/2006

* cited by examiner

CIRCUIT SUBSTRATE FOR MOUNTING ELECTRONIC COMPONENT AND CIRCUIT SUBSTRATE ASSEMBLY HAVING SAME

CROSS-REFERENCE TO RELATED APPLICATIONS

This application is related to commonly-assigned co-pending applications application Ser. No. 12/135,849 entitled, "FLEXIBLE PRINTED CIRCUIT BOARD BASE FILM, FLEXIBLE LAMINATES AND FLEXIBLE PRINTED CIRCUIT BOARDS INCLUDING SAME", filed on the 9 Jun. 2008, and application Ser. No. 12/468,841 entitled, "CIRCUIT SUBSTRATE FOR MOUNTING ELECTRONIC COMPONENT AND CIRCUIT SUBSTRATE ASSEMBLY HAVING SAME", filed on the 19 May 2009. Disclosures of the above identified applications are incorporated herein by reference.

BACKGROUND

1. Technical Field

The present disclosure relates to package substrate, particularly to a circuit substrate suitable for mounting an electronic component and a circuit substrate assembly having the same.

2. Description of Related Art

Printed circuit boards (PCBs) are widely used in various electronic devices such as mobile phones, printing heads, and hard disk drives for having electronic components mounted thereon and providing electrical transmission. With the development of electronic technology, multilayer PCBs frequently replace single sided or double sided PCBs, and electronic components are more often embedded in the PCBs than mounted thereon.

A PCB generally includes electrically conductive layers and insulation layers, each of which has respective electrically conductive patterns defined therein. Each of the insulation layers is positioned between two neighboring electrically conductive layers. Electronic components can be embedded in through holes defined in the insulation layers and electrically connected with the electrically conductive patterns via external connecting means, such as bonding wires and soldering bumps. However, the extra connecting means occupy extra space. Therefore, PCBs seating electronic components occupy considerable space.

Therefore, to overcome the described limitations, it is desirable to provide a compact circuit substrate suitable for having an electronic component mounted thereon and a compact circuit substrate assembly utilizing the circuit substrate.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Figure 1:
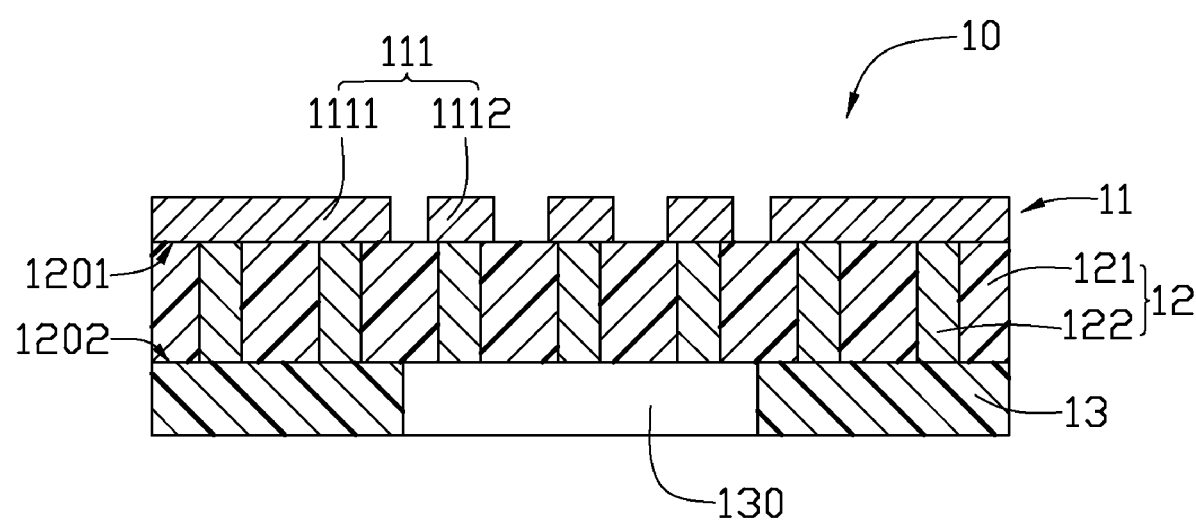
FIG. 1 is a cross sectional view of a circuit substrate in accordance with a first embodiment.

FIG. 1 illustrates a circuit substrate 10 for mounting at least one electronic component thereon, in accordance with a first embodiment. The circuit substrate 10 includes an electrically conductive layer 11, a composite layer 12, and an insulating layer 13 in sequence. The electrically conductive layer 11 can be a copper layer, and has electrically conductive patterns 111 formed therein. The electrically conductive patterns 111 include a plurality of electrical traces 1111 configured for transmitting electrical signals and at least one electrical contact 1112 configured for electrically communicating with the at least one electronic component. In the illustrated embodiment, the electrically conductive patterns 111 include three equidistantly spaced electrical contacts 1112 in a central portion of the electrically conductive layer 11. The composite layer 12 is positioned between the electrically conductive layer 11 and the insulating layer 13, and has a first surface 1201 contacting the electrically conductive layer 11 and a second surface 1202 contacting the insulating layer 13. The insulating layer 13 is configured for supporting the composite layer 12 and the electrically conductive layer 11, and can be polyimide, polyethylene terephtalate, polytetrafluorethylene, polyaminde, polymethylmethacrylate, polycarbonate, polyamide polyethylene-terephthalate copolymer, or glass fiber/resin compound. The insulating layer 13 defines at least one through hole 130 corresponding to the at least one electrical contact 1112. The through hole 130 is configured for accommodating the at least one electronic component. In the illustrated embodiment, the through hole 130 is defined in a central portion of the insulating layer 13, such that a central area of the second surface 1202 is exposed by the through hole 130.

Specifically, the composite layer 12 includes a polymer matrix 121 and at least one carbon nanotube (CNT) bundle 122 embedded therein. The polymer matrix 121 can comprise polyimide, polyethylene terephthalate, polytetrafluorethylene, polyamide, polymethylmethacrylate, polycarbonate, polyamide polyethylene-terephthalate copolymer, glass fiber/resin compound, or other materials. The material of the polymer matrix 121 can be the same as or different from that of the insulating layer 13.

The at least one CNT bundle 122 penetrates the polymer matrix 121, corresponding to the at least one electrical contact 1112 of the electrical conductive patterns 111. The number of the at least one CNT bundle 122 is equal to or greater than the number of the at least one electrical contact 1112. That is, if the electrically conductive patterns 111 include one electrical contact 1112 only, then the composite layer 12 can include one or more CNT bundles 122, and if the electrically conductive patterns 111 include a plurality of electrical contacts 1112, then the composite layer 12 can include a plurality of CNT bundles 122 equaling or exceeding the number of electrical contacts 1112. Accordingly, each electrical contact 1112 of the electrical conductive patterns 111 can be in contact with at least one CNT bundle 122.

In the illustrated embodiment, the composite layer 12 includes a plurality of more than three CNT bundles 122. The CNT bundles 122 are uniformly distributed in the polymer matrix 121, being equidistantly spaced from one another.

Each of the CNT bundles 122 is isolated from other CNT bundles 122 by the polymer matrix 121, being insulated thereby. Each of the CNT bundles 122 includes a plurality of substantially parallel CNTs, and extends from the first surface 1201 to the second surface 1202 inclined at an angle from 80° to 100° relative to the first surface 1201. In other words, CNT bundles 122 are parallel to each other and substantially perpendicular to the first surface 1201 and the second surface 1202.

One end of each of the CNT bundles 122 is exposed at the first surface 1201, and the other at the second surface 1202, such that each of the CNT bundles 122 is substantially the same length or longer than a distance between the first surface 1201 and the second surface 1202. Generally, the length of each of the CNT bundles 122 is from about 1 micrometer (μm) to about 30 μm.

In the illustrated embodiment, three CNT bundles 122 distributed in a central portion of the composite layer 12 each have one end electrically contacting one electrical contact 1112 and another end exposed in the through hole 130. Accordingly, electronic components accommodated in the through hole 130 can electrically contact the three CNT bundles 122 and the electrical contacts 1112 of the electrically conductive layer 11 thereby.

It is noted that one electrical contact 1112 can be electrically in contact with one or more CNT bundles 122, but one CNT bundle 122 can only be electrically in contact with one electrical contact 1112. Therefore, electrical signals transmitted in the electrical contacts 1112 will not be interfered with by CNT bundles 122.

It is also noted that CNT bundles 122 can also be non-uniformly distributed in the composite layer 12 according to practical need, for example, the CNT bundles 122 can be distributed with a variable distribution along an orientation perpendicular to a thickness of the composite layer 12.

Figure 2:
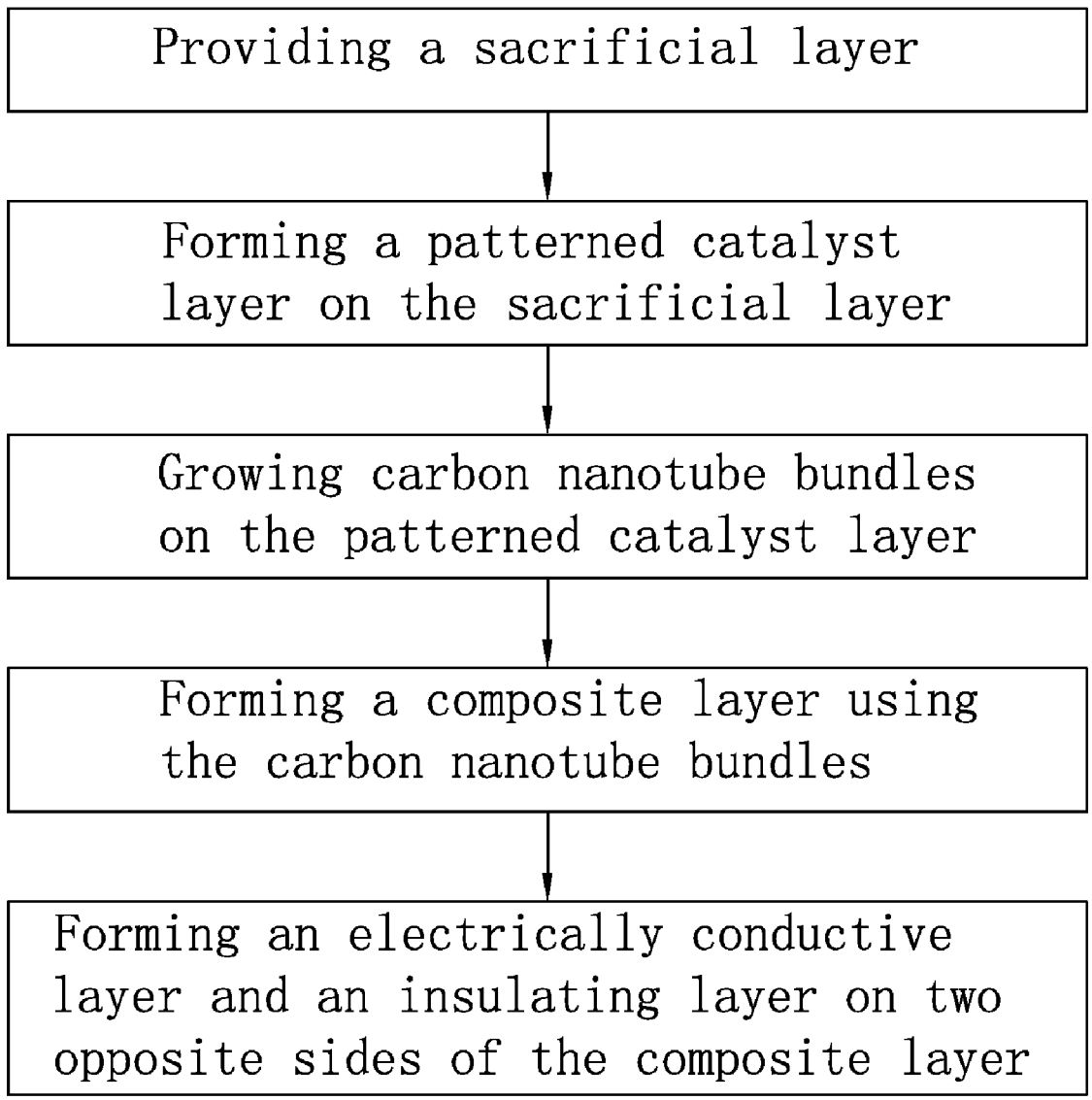
FIG. 2 is a flowchart of a method for manufacturing the circuit substrate of FIG. 1.

FIG. 2 is a flowchart of a method for manufacturing the circuit substrate 10 of FIG. 1, described in detail in FIGS. 3 to 10.

Figure 3:
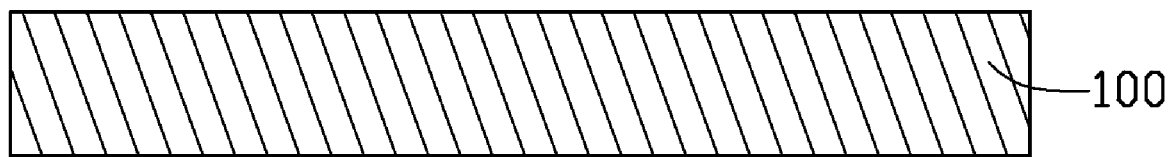
FIG. 3 is a cross sectional view of a sacrificial layer.

In step 1, referring to FIG. 3, a sacrificial layer 100 is provided. The sacrificial layer 100 can be metal such as copper, aluminum, and nickel. A thickness of the sacrificial layer 100 can be from about 2 μm to about 200 μm.

Figure 4:
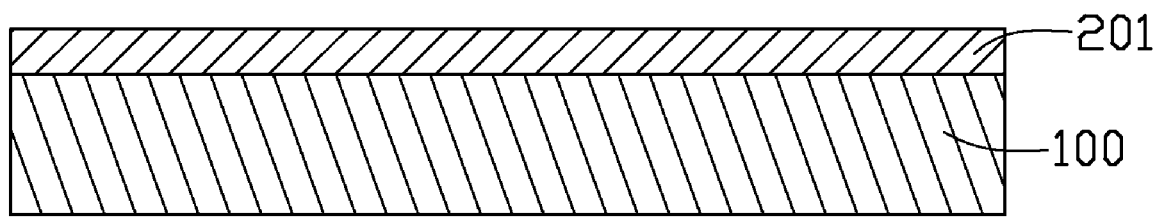
FIG. 4 is similar to FIG. 3, but showing a catalyst precursor layer formed on the sacrificial layer.
Figure 5:
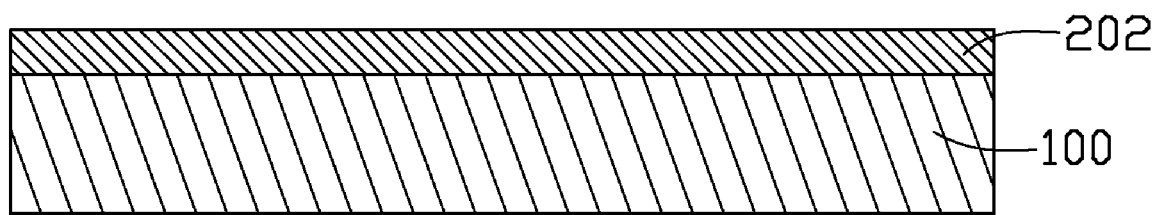
FIG. 5 is similar to FIG. 4, but showing the catalyst precursor layer being oxidized to form a catalyst layer.
Figure 6:
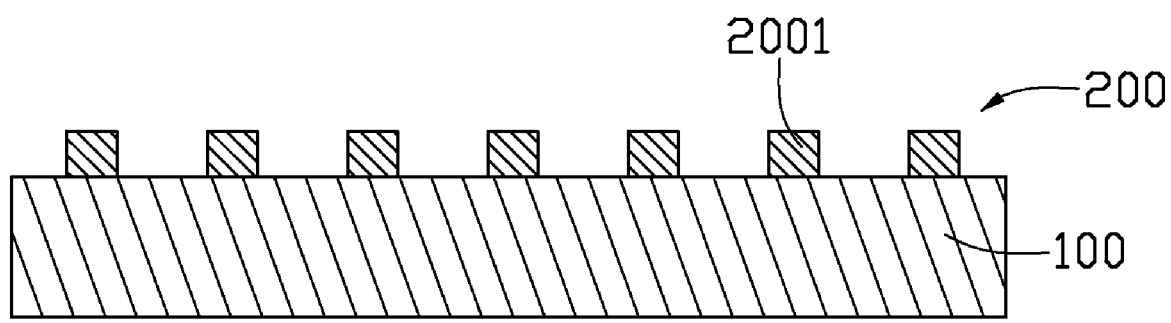
FIG. 6 is similar to FIG. 5, but showing the catalyst layer being patterned to form a patterned catalyst layer.

In step 2, referring to FIGS. 4 to 6, a patterned catalyst layer 200 is formed on the sacrificial layer 100.

Referring to FIG. 4, a catalyst precursor layer 201 of iron, cobalt, nickel, or alloy thereof, is deposited on a surface of the sacrificial layer 100 by electro-deposition, evaporation, sputtering, or vapor deposition.

Referring to FIG. 5, the catalyst precursor layer 201 is oxidized to form a catalyst layer 202. Specifically, the sacrificial layer 100 and the catalyst precursor layer 201 can be sintered in a furnace to oxidize the catalyst precursor layer 201.

Referring to FIG. 6, the catalyst layer 202 is patterned using a lithography method and thereby the patterned catalyst layer 200 is obtained. In the illustrated embodiment, the patterned catalyst layer 200 includes a plurality of equidistantly spaced catalyst blocks 2001, each of which includes a number of catalyst particles distributed therein. It is noted that the patterns formed in the catalyst layer 200 can be other patterns according to practical need.

Figure 7:
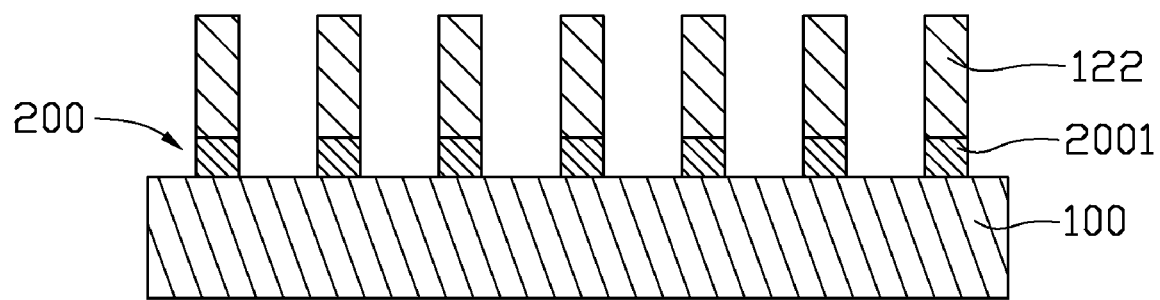
FIG. 7 is similar to FIG. 6, but showing a plurality of carbon nanotube bundles grown on the catalyst layer.

In step 3, referring to FIG. 7, a plurality of CNT bundles 122 are formed on the patterned catalyst layer 200. Each of the CNT bundles 122 is grown on one catalyst block 2001. In detail, the sacrificial layer 100 with the patterned catalyst layer 200 formed thereon is placed on a carrier boat disposed in a reaction furnace, for example, a quartz tube, wherein temperature of the reaction furnace is brought to about 700 to 1000° C. and carbon source gas such as acetylene and ethylene is introduced into the reaction furnace, causing the CNT bundles 122 to grow from the catalyst blocks 2001. The height of the CNT bundles 122 can be determined by controlling the reaction time and an extension axis of the CNT bundles 122 controlled with an electric field.

Figure 8:
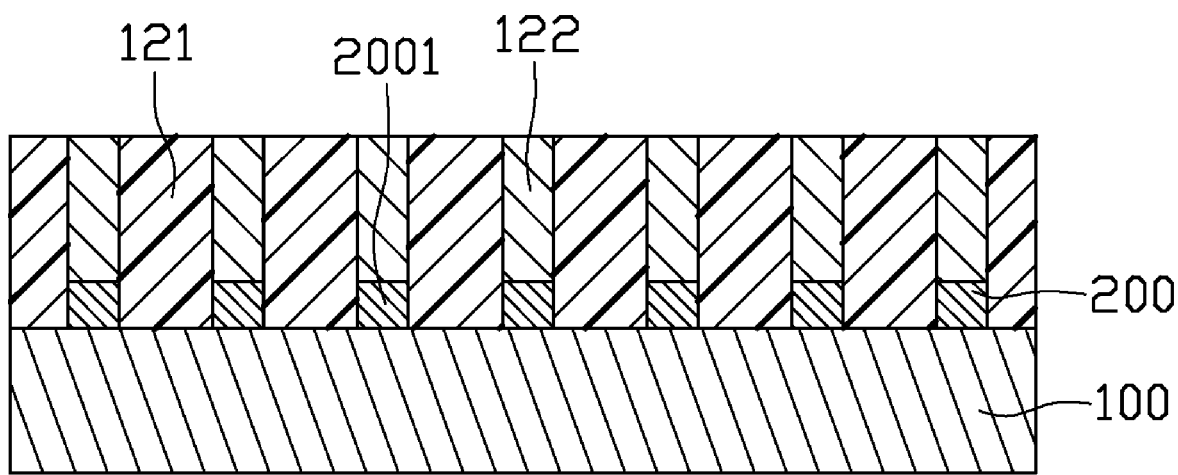
FIG. 8 is similar to FIG. 7, but showing a polymer filled between the carbon nanotube bundles.
Figure 9:
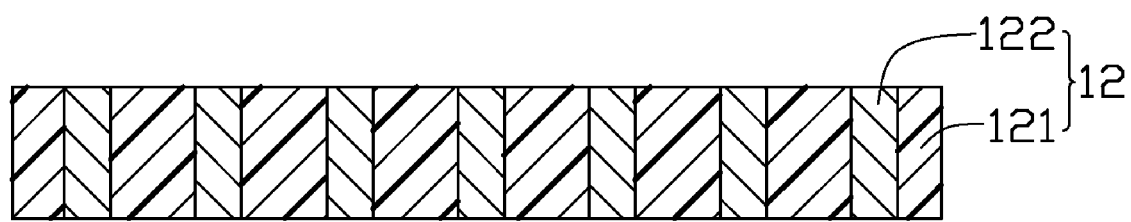
FIG. 9 is similar to FIG. 8, but showing the catalyst layer and the sacrificial layer being removed and thereby obtaining a composite layer including the polymer and the carbon nanotube bundles.

In step 4, referring to FIG. 8 and FIG. 9, the composite layer 12 is formed using the CNT bundles 122.

Referring to FIG. 8, a polymer precursor is filled between the CNT bundles 122, with an end of each thereof exposed from the polymer precursor. Preferably, ultrasonic oscillation is performed during filling of the polymer precursor thoroughly fill the gaps between the CNT bundles 122. It is understood that part of the polymer precursor is filled in the patterned catalyst layer 200, i.e., between the catalyst blocks 2001.

The polymer precursor is then cured. Crosslink reaction occurs in the polymer precursor, and therefore the polymer matrix 121 is formed.

Referring to FIG. 8 and FIG. 9, the sacrificial layer 100 and the patterned catalyst layer 200 are removed. The sacrificial layer 100 can be removed by etching. For example, when the sacrificial layer 100 is copper, ferric chloride solution can etch the sacrificial layer 100. The patterned catalyst layer 200 can be removed using a grinding process. It is noted that part of the polymer matrix 121 filled between the catalyst blocks 2001 is removed simultaneously when the catalyst layer 200 is removed.

After removal of the sacrificial layer 100 and the patterned catalyst layer 200, the composite layer 12 as shown in FIG. 9 is obtained.

Figure 10:
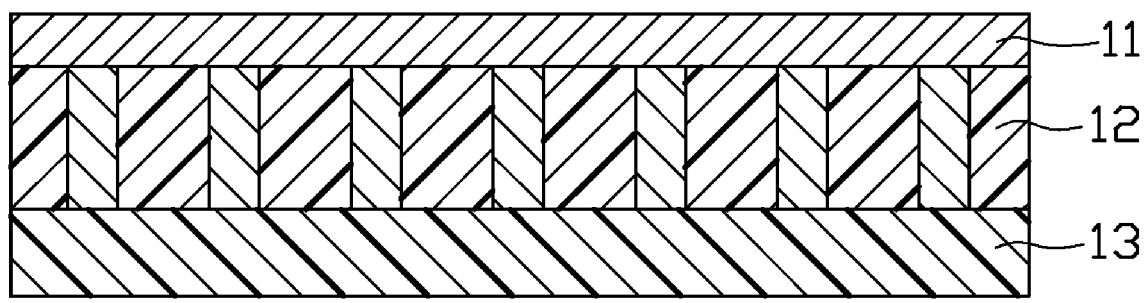
FIG. 10 is similar to FIG. 9, but showing an electrically conductive layer and an insulating layer formed on two opposite sides of the composite layer.

In step 5, referring to FIG. 10, an electrically conductive layer 11 and an insulating layer 13 are formed on two opposite surfaces of the composite layer 12. The electrically conductive layer 11 is processed using a photolithography process and an etching process to form electrically conductive patterns 111. And the insulating layer 13 is drilled to form the through hole 130. Thus, the circuit substrate 10 as shown in FIG. 1 is obtained.

Figure 11:
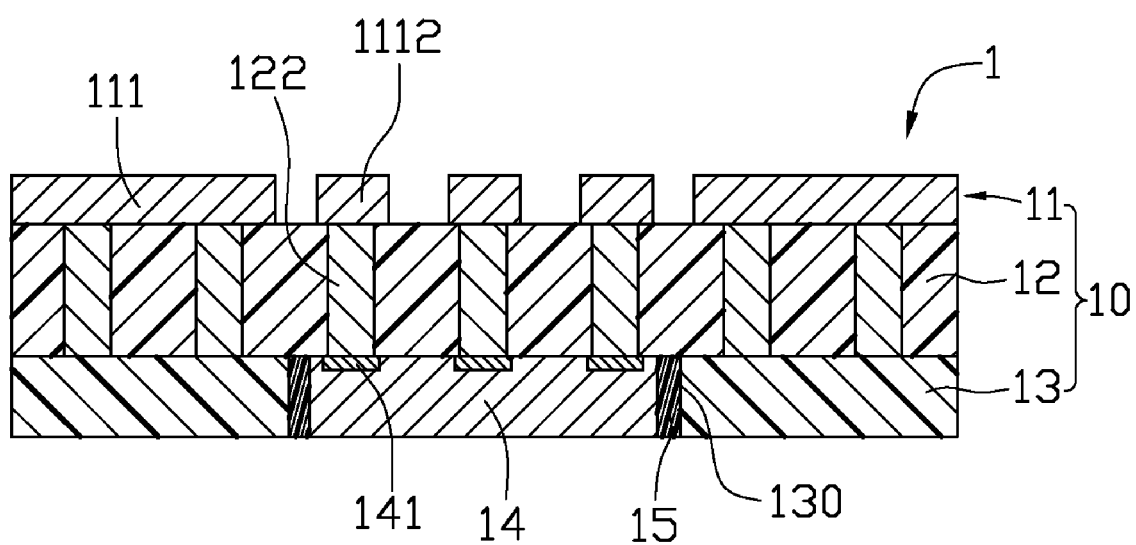
FIG. 11 is a cross sectional view of a circuit substrate assembly including the circuit substrate of FIG. 1, in accordance with a second embodiment.

FIG. 11 illustrates a circuit substrate assembly 1 in accordance with a second embodiment, differing from the circuit substrate 10 of FIG. 1 only in the presence of an electronic component 14 thereon. The electronic component 14 can be a passive component, an active component, an optoelectronics element, a semiconductor chip or other suitable element, and has three electrical terminals 141 defined in a top portion thereof. In the illustrated embodiment, the three electrical terminals 141 are spaced equidistant from one another, and a distance between two neighboring electrical terminals 141 is substantially equal to a distance between two neighboring CNT bundles 122.

The electronic component 14 is received in the through hole 130, encapsulated by epoxy resin 15, and electrically communicated with the electrical contacts 1112 of the electrically conductive patterns 111 by three CNT bundles 122, exposed in the through hole 130. That is, each of the electrical terminals 141 electrically in contact with one of the three CNT bundles 122.

It is understood that each of the electrical terminals 141 can also be electrically in contact with two or more CNT bundles 122 according to practical need. In addition, if the electronic component 14 has only one electrical terminal 141, the composite layer 12 can present only one corresponding CNT bundle 122.

In the circuit substrate assembly 1, CNT bundles 122 electrically connect electrically conductive patterns 111 and the electrical terminals 141 of the electronic component 14 embedded in the through hole 130. Therefore, the circuit substrate assembly 1 has compact size and occupies less space.

Figure 12:
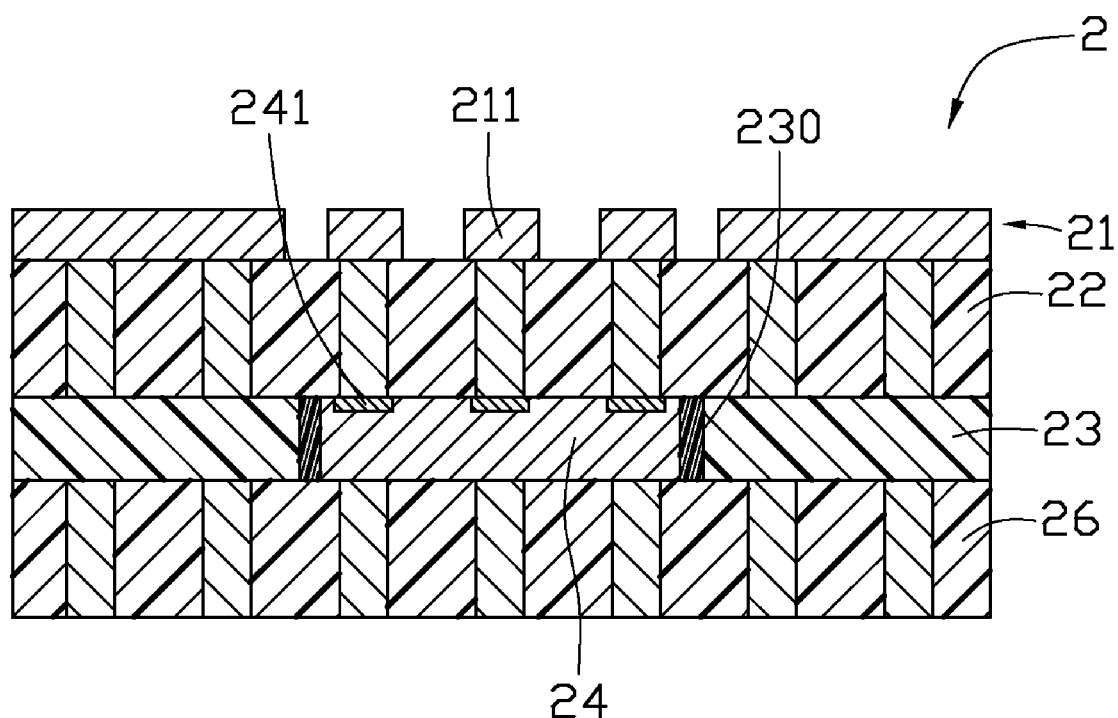
FIG. 12 is a cross sectional view of a circuit substrate assembly in accordance with a third embodiment.

FIG. 12 illustrates a circuit substrate assembly 2 in accordance with a third embodiment. The circuit substrate assembly 2 includes an electrically conductive layer 21, a first composite layer 22, an insulating layer 23, an electronic component 24, and a second composite layer 26. The first and second composite layers 22, 26 have structures similar to that of the composite layer 12 of FIG. 1. That is, each of the first and second composite layers 22, 26 has polymer matrix and CNT bundles embedded therein. The CNT bundles penetrate the polymer matrix and are insulated from each other.

The electrically conductive layer 21 has electrically conductive patterns 211 formed therein. The first composite layer 22 is positioned between the electrically conductive layer 21 and the insulating layer 23. The insulating layer 23 is positioned between the first composite layer 22 and the second composite layer 26, and defines a through hole 230 in a central portion thereof. The electronic component 24 is received in the through hole 230, and has three electrical terminals 241 in a top portion thereof. Each of the electrical terminals 241 is in contact with one CNT bundle in the first composite layer 22. Thus, the electronic component 24 can be electrically connected with the electrically conductive patterns 211 via three CNT bundles.

In addition, a central portion of the second composite layer 26 is in contact with a bottom portion of the electronic component 24. In the illustrated embodiment, three CNT bundles positioned in the central portion of the second composite layer 26 is in contact with a bottom surface of the electronic component 24. Heat generated in the electronic component 24 can thus be efficiently conducted and dissipated to the outside via the three CNT bundles of the second composite layer 26. Thermal dissipating ability of the circuit substrate assembly 2 has been improved.

Figure 13:
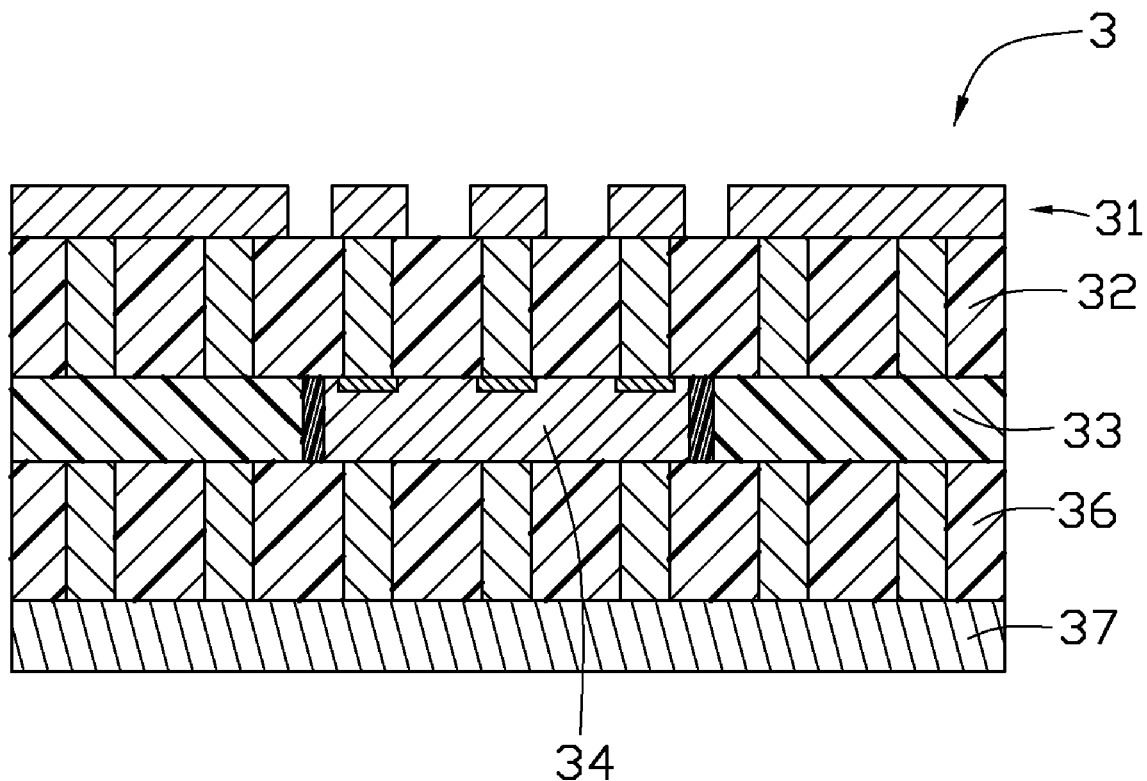
FIG. 13 is a cross sectional view of a circuit substrate assembly in accordance with a fourth embodiment.

FIG. 13 illustrates a circuit substrate assembly 3 in accordance with a fourth embodiment, differing from that of the third embodiment shown in FIG. 12 only in the inclusion of a metal base layer 37. That is, the circuit substrate assembly 3 includes an electrically conductive layer 31, a first composite layer 32, an insulating layer 33, an electronic component 34, a second composite layer 36 and the metal base layer 37. The second composite layer 36 is positioned between the insulating layer 33 and the metal base layer 37. Thus, CNT bundles of the second composite layer 36 are in contact with the metal base layer 37. The metal base layer 37 can be made of a material with a high thermal conductivity, such as copper and aluminum, such that heat generated by the electronic component 34 is efficiently conducted and dissipated to the outside via the CNT bundles of the second composite layer 36 and the metal base layer 37.

Figure 14:
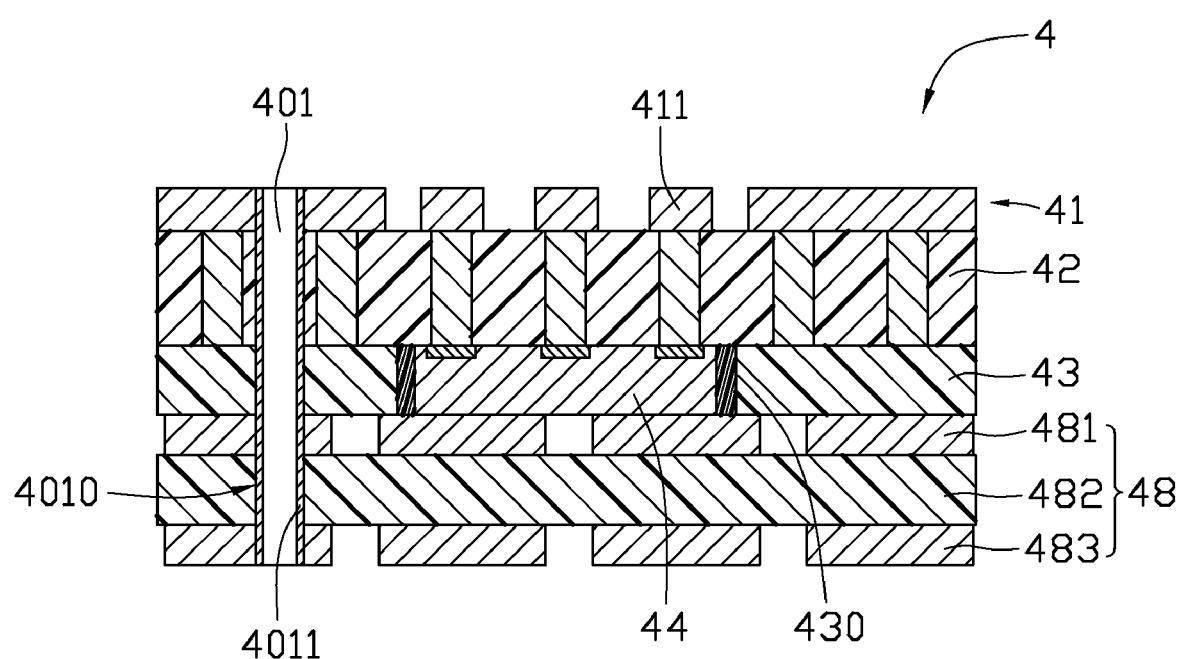
FIG. 14 is a cross sectional view of a circuit substrate assembly in accordance with a fifth embodiment.

FIG. 14 illustrates a circuit substrate assembly 4 in accordance with a fifth embodiment. The circuit substrate assembly 4 includes a first electrically conductive layer 41, a composite layer 42, a first insulating layer 43, an electronic component 44, and a PCB substrate 48.

The first electrically conductive layer 41 has electrically conductive patterns 411 formed therein. The composite layer 42 is positioned between the electrically conductive layer 41 and the first insulating layer 43, and has structures similar to that of the composite layer 12 of FIG. 1. The first insulating layer 43 defines a through hole 430 in a central portion thereof. The electronic component 44 is received in the through hole 430, and electrically connected with electrically conductive patterns 411 via CNT bundles embedded in the composite layer 42.

In the illustrated embodiment, the PCB substrate 48 is a double-sided PCB substrate, and includes a second electrically conductive layer 481, a second insulating layer 482, and a third electrically conductive layer 483. The second electrically conductive layer 481 is formed on a top surface of the second insulating layer 482, and is positioned between the first insulating layer 43 and the second insulating layer 482. The second insulating layer 482 is positioned between the second electrically conductive layer 481 and the third electrically conductive layer 483. The third electrically conductive layer 483 is formed on a bottom surface of the second insulating layer 482 and at an opposite side thereof to the second electrically conductive layer 481. The second and third electrically conductive layers 481, 483 have respective electrically conductive patterns formed therein.

In addition, the circuit substrate assembly 4 defines a plated through hole 401 therein. The plated through hole 401 extends through the first electrically conductive layer 41, the composite layer 42, the first insulating layer 43, and the PCB substrate 48. The circuit substrate assembly 4 has a plated copper layer 4011 in an inner surface 4010 in the plated through hole 401, therefore, the first, second, and third electrically conductive layers 41, 481, and 483 are electrically connected therebetween. Thus, electrical signals can be transmitted in the first, second, and third electrically conductive layers 41, 481, and 483 from each other.

It is noted that two or more plated through holes also can be formed in the circuit substrate assembly 4. In addition, blind vias and buried vias also can be formed in the circuit substrate assembly 4.

It is also noted that the PCB substrate 48 is not limited to be a double-sided PCB substrate, single-sided PCB substrate or multilayer PCB substrate also can be adopted as practical need.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A circuit substrate assembly, comprising:
an electrically conductive layer comprising a plurality of signal-transmitting electrical traces configured for transmitting electrical signals and at least one electrical contact;
an insulating layer defining a through hole therein;
an electronic component accommodated in the through hole of the insulating layer, the electronic component comprising at least one electrical terminal; and
a composite layer positioned between the electrically conductive layer and the insulating layer, the electrically conductive layer being located on one side of the composite layer, the composite layer having a first surface contacting the electrically conductive layer and an opposite second surface contacting the insulating layer, the composite layer being in contact with each of the signal-transmitting electrical traces and the at least one electrical contact, the composite layer comprising a polymer matrix and at least one carbon nanotube bundle embedded in the polymer matrix, an end of the at least one carbon nanotube bundle being in contact with the at least one electrical contact of the electrically conductive layer, another end of the at least one carbon nanotube bundle being exposed in the through hole of the insulation layer and electrically in contact with the at least one electrical terminal of the electronic component.

2. The circuit substrate assembly as claimed in claim 1, further comprising another composite layer, wherein the two composite layers have the same structure, and the two composite layers are formed at two opposite sides of the insulating layer.

3. The circuit substrate assembly as claimed in claim 2, wherein the electronic component is in contact with the two composite layers.

4. The circuit substrate assembly as claimed in claim 1, further comprising a metal base layer and another composite layer positioned between the insulating layer and the metal base layer, wherein the two composite layers have the same structure.

5. The circuit substrate assembly as claimed in claim 1, further comprising a printed circuit board substrate, wherein the insulating layer is positioned between the composite layer and the printed circuit board substrate.

6. The circuit substrate assembly as claimed in claim 5, wherein a via or a plated through hole is defined in the circuit substrate assembly to electrically connect the electrically conductive layer and the printed circuit board substrate.

7. The circuit substrate assembly as claimed in claim 1, wherein the electronic component is encapsulated by epoxy resin.

8. A circuit substrate assembly, comprising:
a first insulating layer defining a through hole therein;
an electronic component accommodated in the through hole of the first insulating layer, the electronic component comprising a plurality of electrical terminals;
a first electrically conductive layer comprising a plurality of signal-transmitting electrical traces configured for transmitting electrical signals and a plurality of electrical contacts for electrically communicating with the electronic component, the electrical contacts spatially corresponding to the through hole; and
a composite layer positioned between the first electrically conductive layer and the first insulating layer, the electrically conductive layer being entirely located on one side of the composite layer, the composite layer comprising a polymer matrix and a plurality of carbon nanotube bundles embedded within the polymer matrix, the polymer matrix including a first surface being in contact with the first electrically conductive layer and an opposite second surface being in contact with the first insulating layer, the carbon nanotube bundles extending from the first surface to the second surface at an angle of from 80° to 100° relative to the first surface and being exposed at the first and second surfaces, at least a portion of the carbon nanotube bundles being in contact with the electrical terminals and the electrical contacts, and each of the electrical terminals electrically communicating with a corresponding electrical contact by at least one carbon nanotube bundle.

9. The circuit substrate assembly as claimed in claim 8, further comprising a printed circuit board substrate, the printed circuit board substrate comprising a second electrically conductive layer, a second insulating layer, and a third electrically conductive layer, the second electrically conductive layer being in contact with the electronic component, the second insulating layer being sandwiched between the second and third electrically conductive layers, and the second and third electrically conductive layers having electrically conductive patterns formed therein, respectively.

10. The circuit substrate as claimed in claim 8, wherein the number of the electrical contacts is equal to the number of the carbon nanotube bundles.

11. The circuit substrate as claimed in claim 8, wherein the number of the carbon nanotube bundles is greater than the number of the electrical contacts.

12. The circuit substrate as claimed in claim 8, wherein an end of each of the carbon nanotube bundles is exposed at the first surface, another end of each of the carbon nanotube bundles is exposed at the second surface, and a length of each of the carbon nanotube bundles is substantially equal to a distance between the first surface and the second surface.

13. The circuit substrate as claimed in claim 12, wherein each of the carbon nanotube bundles is isolated from other carbon nanotube bundles by the polymer matrix.

14. The circuit substrate as claimed in claim 12, wherein the carbon nanotube bundles are substantially parallel to each other.

15. The circuit substrate as claimed in claim 13, wherein the carbon nanotube bundles are equidistantly spaced from one another.

16. A circuit substrate assembly, comprising:
an insulating layer defining a through hole therein;
an electronic component accommodated in the through hole of the first insulating layer, the electronic component comprising a plurality of electrical terminals;
an electrically conductive layer comprising a plurality of signal-transmitting electrical traces configured for transmitting electrical signals and a plurality of electrical contacts for electrically communicating with the electronic component, the electrical contacts spatially corresponding to the through hole; and
a composite layer positioned between the electrically conductive layer and the first insulating layer, the electrically conductive layer being entirely located on one side of the composite layer, the composite layer comprising a polymer matrix and a plurality of carbon nanotube bundles embedded within the polymer matrix, the polymer matrix including a first surface being in contact with the electrically conductive layer and a second surface being in contact with the first insulating layer, the carbon nanotube bundles extending from the first surface to the second surface at an angle of from 80° to 100° relative to the first surface and being exposed at the first and second surfaces, each of the carbon nanotube bundles being isolated from other carbon nanotube bundles by the polymer matrix, each of the carbon nanotube bundles having an end being in contact with one electrical contact and another end being in contact with a corresponding electrical terminal so as to electrically connect the electrically conductive layer and the electronic component.

17. The circuit substrate assembly as claimed in claim 16, further comprising another composite layer, wherein the two composite layers are formed at two opposite sides of the insulating layer, and the electronic component is in contact with the two composite layers.

18. The circuit substrate assembly as claimed in claim 16, further comprising a metal base layer and another composite layer positioned between the insulating layer and the metal base layer.

19. The circuit substrate assembly as claimed in claim 16, further comprising a printed circuit board substrate, wherein the insulating layer is positioned between the composite layer and the printed circuit board substrate.

20. The circuit substrate assembly as claimed in claim 19, wherein a via or a plated through hole is defined in the circuit substrate assembly to electrically connect the electrically conductive layer and the printed circuit board substrate.

* * * * *

UNITED STATES PATENT AND TRADEMARK OFFICE
CERTIFICATE OF CORRECTION

| | | |
|---|---|---|
| PATENT NO. | : 8,300,420 B2 | Page 1 of 1 |
| APPLICATION NO. | : 12/471396 | |
| DATED | : October 30, 2012 | |
| INVENTOR(S) | : Chung-Jen Tsai et al. | |

It is certified that error appears in the above-identified patent and that said Letters Patent is hereby corrected as shown below:

On the Title page, please add Item (30) regarding "Foreign Application Priority Data":

(30) Sep. 3, 2008 (CN) ..............................2008 1 0304353.5

Signed and Sealed this
Thirtieth Day of April, 2013

Teresa Stanek Rea
*Acting Director of the United States Patent and Trademark Office*